(12) United States Patent
Wildhagen

(10) Patent No.: US 7,369,826 B2
(45) Date of Patent: May 6, 2008

(54) METHOD FOR MONITORING BROADCAST SIGNALS AT ALTERNATIVE FREQUENCIES AND GAIN CONTROL UNIT

(75) Inventor: Jens Wildhagen, Weinstadt (DE)

(73) Assignee: Sony Deutschland GmbH, Cologne (DE)

( * ) Notice: Subject to any disclaimer, the term of this patent is extended or adjusted under 35 U.S.C. 154(b) by 0 days.

(21) Appl. No.: 10/539,869

(22) PCT Filed: Dec. 16, 2003

(86) PCT No.: PCT/EP03/14335

§ 371 (c)(1),
(2), (4) Date: Jun. 17, 2005

(87) PCT Pub. No.: WO2004/057781

PCT Pub. Date: Jul. 8, 2004

(65) Prior Publication Data

US 2006/0099923 A1    May 11, 2006

(30) Foreign Application Priority Data

Dec. 20, 2002 (EP) .................................. 02028639

(51) Int. Cl.
*H04B 1/18* (2006.01)

(52) U.S. Cl. .............................. 455/179.1; 455/184.1; 455/185.1; 455/186.1; 455/161.3; 455/234.1

(58) Field of Classification Search ............. 455/179.1, 455/184.1, 185.1, 186.1, 186.2, 234.1, 234.2, 455/161.1, 161.2, 161.3, 165.1, 166.1, 166.2
See application file for complete search history.

(56) References Cited

U.S. PATENT DOCUMENTS

| | | | |
|---|---|---|---|
| 5,220,682 A * | 6/1993 | Tomohiro | ................. 455/161.2 |
| 5,222,254 A | 6/1993 | Verron et al. | |
| 5,345,602 A * | 9/1994 | Wiedemann et al. | ........ 455/137 |
| 5,390,343 A * | 2/1995 | Rupprecht et al. | ........ 455/161.3 |
| 5,404,588 A * | 4/1995 | Henze | ...................... 455/186.1 |
| 5,428,825 A * | 6/1995 | Tomohiro et al. | ......... 455/186.1 |
| 5,745,845 A * | 4/1998 | Suenaga et al. | .......... 455/194.1 |
| 6,094,568 A * | 7/2000 | Kianush et al. | ........... 455/161.1 |
| 6,141,536 A * | 10/2000 | Cvetkovic et al. | ............. 455/45 |
| 6,256,377 B1 * | 7/2001 | Murphree et al. | ............. 379/24 |
| 6,314,278 B1 * | 11/2001 | Zamat | ...................... 455/239.1 |
| 6,522,866 B1 * | 2/2003 | Merkle et al. | ................. 455/59 |
| 6,628,930 B1 * | 9/2003 | Vogt et al. | ................... 455/131 |
| 6,640,093 B1 * | 10/2003 | Wildhagen | ................... 455/130 |
| 6,711,390 B1 * | 3/2004 | Moers | ...................... 455/186.1 |

(Continued)

FOREIGN PATENT DOCUMENTS

| | | |
|---|---|---|
| EP | 0 558 918 | 9/1993 |
| EP | 0 597 492 | 5/1994 |
| EP | 0 734 128 | 9/1996 |

*Primary Examiner*—Edward F. Urban
*Assistant Examiner*—RuiMeng Hu
(74) *Attorney, Agent, or Firm*—Frommer Lawrence & Haug LLP; William S. Frommer; Thomas F. Presson

(57) ABSTRACT

Many broadcast stations transmit their programs via a variety of different frequencies. The invention relates to monitoring alternative frequencies during the reception of a broadcast signal at a present frequency. Whenever the broadcast signal at an alternative frequency is checked, the receiver's gain is instantaneously switched from a present gain value corresponding to the present frequency to a second gain value corresponding to the alternative frequency. The second gain value is adapted to the supposed signal strength of the broadcast signal at the alternative frequency.

16 Claims, 2 Drawing Sheets

U.S. PATENT DOCUMENTS

| | | | |
|---|---|---|---|
| 6,748,237 B1* | 6/2004 | Bates et al. | 455/553.1 |
| 6,792,258 B1* | 9/2004 | Nokes et al. | 455/277.2 |
| 7,224,675 B1* | 5/2007 | Merkle et al. | 370/330 |
| 2002/0149707 A1* | 10/2002 | Van Der Wijst et al. | 348/820 |
| 2002/0150182 A1* | 10/2002 | Dogan et al. | 375/343 |
| 2003/0153292 A1* | 8/2003 | Groeger et al. | 455/221 |
| 2004/0110522 A1* | 6/2004 | Howard et al. | 455/512 |

* cited by examiner

METHOD FOR MONITORING BROADCAST SIGNALS AT ALTERNATIVE FREQUENCIES AND GAIN CONTROL UNIT

The invention relates to a gain control unit, to a receiver and to a method for monitoring broadcast signals at alternative frequencies during the reception of a broadcast signal at a present frequency.

Many radio stations transmit their radio programs via a variety of different broadcast frequencies. When receiving a certain radio program at a present frequency, a receiver may at the same time monitor alternative frequencies, in order to compare the signal strength and the signal quality at said alternative frequencies to the reception conditions of the present frequency. In case the signal received at the present frequency is impaired by distortions, the receiver may switch to a different one of the variety of frequencies on which the respective radio program is transmitted. Thus, the multitude of available frequencies guarantees a certain quality level of the received signal.

Switching from one received frequency to another frequency requires to readjust the gain of the receiver circuitry. Depending on the respective type of the automatic gain control loop used in the receiver, the gain adjustment might take quite long. Depending on the design of the gain control loop, fast gain adjustments using short time constants lead to instabilities of the loop.

It is therefore an object of the invention to speed up the monitoring of broadcast signals at alternative frequencies.

The object of the invention is solved by a method for monitoring broadcast signals at alternative frequencies according to claim 1 and by a receiver according to claim 12. Preferred embodiments thereof are respectively defined in the following dependent sub-claims. A computer program product according to the present invention is defined in claim 14.

According to the invention, broadcast signals at alternative frequencies are monitored during the reception of a broadcast signal at a present frequency. Whenever the broadcast signal at an alternative frequency is checked, the receiver's gain is instantaneously switched from a present gain value corresponding to said present frequency to a second gain value corresponding to an alternative frequency, whereby the second gain value is adapted to the supposed signal strength of the broadcast signal at said alternative frequency.

In prior art solutions, the receiver's gain has been adjusted by means of the receiver's closed-loop control circuit. Especially in case the gain of the RF amplifier is varied, it takes quite a while until the control loop has settled to the correct gain value. During the settling time, the signal quality of the broadcast signal received at an alternative frequency cannot be evaluated.

According to the invention, whenever the broadcast signal is switched to an alternative frequency, a corresponding gain value is written to the automatic gain control circuit. Thus, the correct gain value is available right from the beginning. The settling time (in the order of 10-20 msec, depending on the AGC design) is replaced by a setting time of less than 1 msec, and therefore, only a small period of time is required for checking a broadcast signal at a certain alternative frequency. A lot of different alternative frequencies can be monitored during the reception of a broadcast signal at the present frequency. In order to optimise the reception conditions, the receiver selects the frequency where the signal quality is best.

According to a preferred embodiment of the invention, it is determined whether the program transmitted via the broadcast signal at said alternative frequency is the same as the program transmitted. The listener has selected the program he wants to listen to. Therefore, switching to an alternative frequency may only be performed if the program transmitted via said alternative frequency is the same as the program transmitted via the present frequency.

Preferably, the signal strength of the broadcast signal received at the alternative frequency is compared to the signal strength of the broadcast signal received at the present frequency. In case it turns out that the signal strength of the broadcast signal at the alternative frequency is higher than the signal strength at the present frequency, is makes sense to switch to said alternative frequency, because the reception conditions at said alternative frequency are likely to be superior to the present reception conditions. In case the signal strength of the alternative frequency is worse than the signal strength at the present frequency, it is better to stay at the present frequency.

Preferably, in case the signal strength of the broadcast signal at the alternative frequency surpasses the signal strength of the signal at the present frequency by a predefined amount, and in case the programs transmitted at both frequencies are identical, the received frequency is switched from the present frequency to the alternative frequency. Before switching is performed, two prerequisites have to be fulfilled: the audio program transmitted at the alternative frequency has to be the same as the present audio program, and the signal quality at the alternative frequency channel has to be superior to the present signal quality.

According to a preferred embodiment of the invention, both the broadcast signal received at said present frequency and the broadcast signal received at said alternative frequency are broadcast signals according to the DRM standard. The standard DRM (Digital Radio Mondiale) is the digital equivalent of an analogue broadcast signal in the medium wave range of radio transmission.

Preferably, alternative frequencies are monitored during time slots of static data symbol transmission, whereby during a first time slot, the receiver's gain control circuit settles to said second gain value, and whereby during a second time slot of static data symbol transmission, the receiver's gain is instantaneously switched to said second gain value. According to the standard DRM, the transmission of a data stream corresponding to the respective audio program is periodically interrupted by time slots of static data symbol transmission. During these time slots, a predefined sequence of bits is transmitted, and for this reason, these time slots can be used for monitoring alternative frequencies. Especially in case of a slowly reacting gain control circuit, the length of a single time slot is too short for adjusting the receiver's gain to the new broadcast signal, for detecting whether the same program is transmitted, and for determining the signal strength at said alternative signal. Therefore, a first time slot is spent for determining the correct gain value for the signal at said alternative frequency. At the end of the first time slot, the receiver's gain control circuit has settled to the correct gain value, and said gain value is stored. After the first gain adjustment, the gain is switched back to the original level the AGC had before the alternative frequency was checked. At the beginning of the next time slot, or of any following time slot, the gain value that corresponds to the alternative frequency channel is written to the receiver's AGC, and the receiver's gain is instantaneously switched to said gain value. Said time slot is then used for determining the signal strength at said alternative frequency, and for detecting which program is transmitted at the alternative frequency. During the second time slot, the rather long settling time is not required anymore. Since the AGC is switched, the gain control loop is switched off, the AGC can not become unstable. The whole second time slot is available for analysing the broadcast signal at said alternative frequency. Even in case the automatic gain control of a DRM receiver reacts rather slowly, it becomes possible the track the signal strengths of a variety of alternative frequencies.

Further preferably, said broadcast signal received at said present frequency is correlated with said broadcast signal received at said alternative frequency. In case the audio programs transmitted at the present frequency and at the alternative frequency are identical, a good correlation of the bit streams received at said two frequencies is obtained. In case different programs are transmitted, there is no correlation at all. Correlating said two bit streams leads to an unambiguous result.

According to another preferred embodiment of the invention, both the broadcast signal received at said present frequency and the broadcast signal received at said alternative frequency are FM signals. Also FM stations often transmit their radio programs via a set of different frequencies.

Preferably, from a RDS signal component of the broadcast signal received at the alternative frequency, a PI code of the broadcast signal at the alternative frequency is derived, and said PI code of the alternative frequency is compared with the PI code of the present frequency. A FM broadcast signal comprises a RDS signal component with a PI code indicating the respective program or the respective station that is transmitted via said FM signal. Comparing the PI codes of the alternative frequency with the present frequency's PI code is the easiest way to determine whether both programs are identical or not. Other methods are also possible.

Preferably, the second gain value is set to a predefined constant. By choosing a constant that is sufficiently low, saturation of the A/D converter can be avoided.

According to a preferred embodiment of the invention, the second gain value is determined by reducing the present gain value by a predefined constant. For example, the second gain value might be obtained by reducing the present gain value by 40 dB. Alternatively, the gain is switched to a predetermined value. Even in case the signal received at the alternative frequency is rather strong, overflow of the control circuit's IF A/D converter is avoided, whereby the signal at the IF A/D converter's input is still sufficiently high to determine the signal strength. In case of a weak signal received at the alternative frequency, the reduced gain will decrease the amplitude of the A/D converter's input signal. This is not a disadvantage, though, because in case the signal strength at an alternative frequency is not considerably higher than the signal strength at the present frequency, said alternative frequency doesn't have to be considered anyway. Alternatively, it is possible to iteratively reduce the present gain value until there is no overflow anymore, for example in two gain steps with a step width of 40 dB each.

Preferably, for each of a set of alternative frequencies, a corresponding gain value adapted to the signal strength of the broadcast signal at said alternative frequency is stored. Further preferably, the gain values corresponding to the various alternative frequencies may be stored in a table maintained at the gain control circuitry. Said table contains, for each of said frequencies, the most recent gain value. Whenever a certain alternative frequency is monitored, the gain is instantaneously switched to the respective gain value obtained from said table. This gain value has the right order of magnitude, and therefore, the evaluation and analysis of the broadcast signal received at the respective alternative frequency can start immediately. In a short period of time, a lot of different alternative frequencies can be monitored, and the frequency with the best signal quality can be selected.

The invention is explained taking reference to the following remarks:

The invention is related to the test of alternative frequencies for broadcast systems like FM or DRM. The invention describes a strategy in receivers with a digital controlled AGC that allows quick checks of alternative frequencies.

In a receiver with a long delay in the AGC loop, for example in an AGC loop that is controlled by the IF signal and that controls the RF amplifier of the receiver, a fast time constant of the loop can not be implemented. A fast time constant would lead to an instable AGC loop.

A DRM receiver checks the alternative frequency by switching from the current frequency to a possible alternative frequency and checks the data by a correlation of the received data with the expected data. The time for switching the PLL to the alternative frequency, setting the AGC gain, reading the data from the alternative frequency, switching back the PLL to the original frequency and setting the AGC to the original level is very short. In case the AGC can only be realised with a long time constant, as it is the case in the receiver above, the programmable AGC can be used to solve the problem.

The receiver performs the DRM AF check in two steps: In a first step, during the first Static Data symbol, the receiver stores the AGC control voltage (corresponding to a certain fieldstrength) of the current station. Then the receiver switches to the alternative frequency. The AGC needs some time for settling to the correct gain, for example about 10-20 ms. The receiver stores the final AGC control value that corresponds to the fieldstrength of the station at the alternative frequency. Then the receiver switches back to the originally received frequency. The AGC control voltage is switched back to the stored value of the received station.

In a second step, during the next static data symbol, the receiver switches back to the same alternative frequency. The AGC sets the previously (in step 1) determined AGC control value, so that the AGC gain is in the correct range. The slow AGC does not need any settling any more, so the receiver can directly check the data of the alternative frequency.

In order to avoid an IF ADC overflow, the AGC gain should slightly be reduced when switching to the AF the second time. A low IF ADC input range can be handled by the digital signal processing, a too high IF ADC input signal leads to an IF ADC saturation. The AF can not be checked.

A similar system could be used to check alternative frequencies in FM broadcast. The receiver knows the fieldstrength of the current station. The receiver only switches to the AF in case the fieldstrength of the AF is higher. In case of a slow AGC, the AGC switches to a lower gain than the gain at the current station to check the alternative frequency. For example, the AGC gain is reduced by 40 dB or more (depending on the current fieldstrength) during the switching to the alternative frequency. In a first step, the receiver only measures the fieldstrength of the AF: The AGC gain is reduced by about 40 dB, so that there is a low risk that the IF ADC is in saturation. The receiver measures the fieldstrength of the AF by combining the knowledge of the AGC gain (that was set manually) and the measurement of the amplitude of the FM input signal in the digital receiver. In a more advanced receiver, the receiver stores the results of the measurements of the fieldstrengths of the alternative frequencies and uses this information to set the proper AGC gain before the actual fieldstrength measurement is done. In a second step, the receiver properly sets the AGC gain and starts with the decoding of the RDS data to check the stations PI code According to the present invention, inter alia a method is proposed that is required to perform a DRM AF check in a receiver with a slow AGC loop.

In the following, the invention will be described in more detail taking reference to the accompanying figures on the basis of preferred embodiments of the invention.

Figure 1:
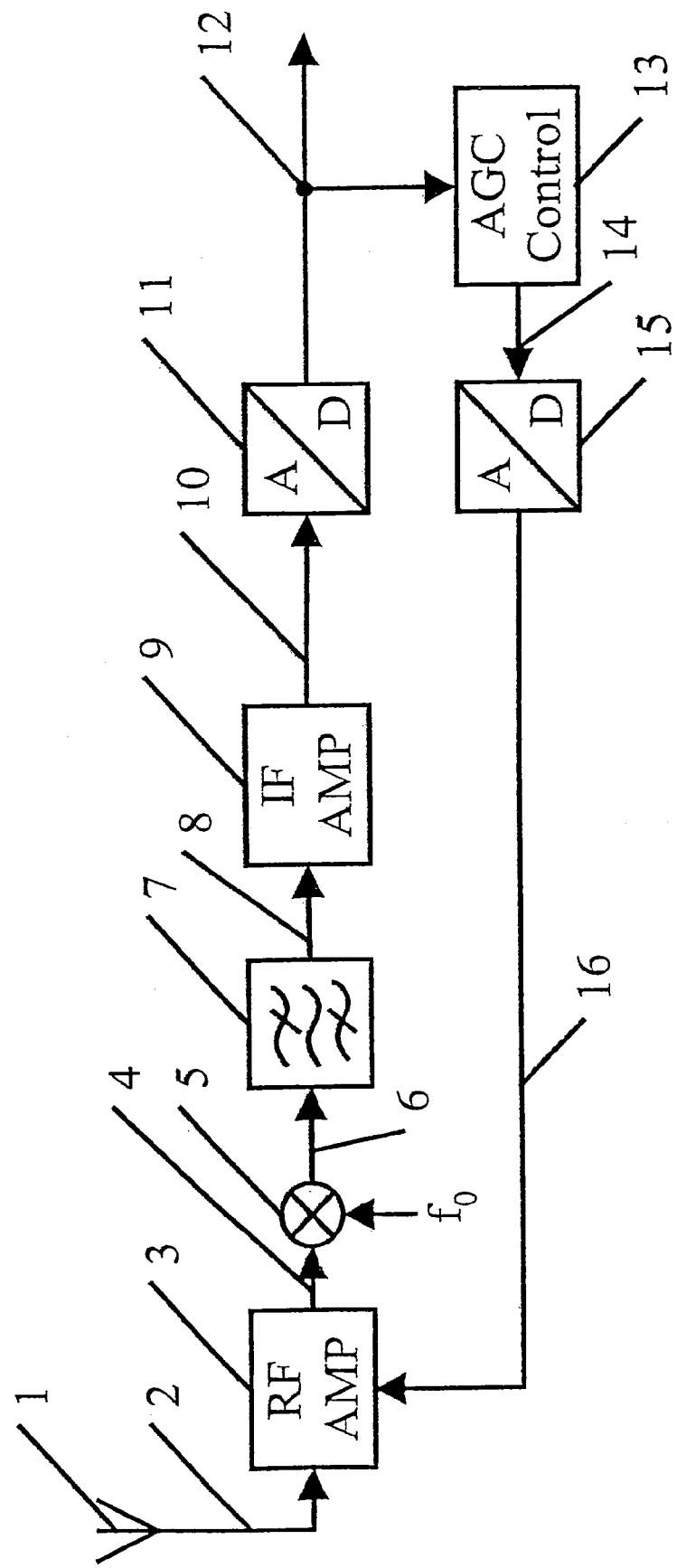
FIG. 1 is a receiver with a gain control loop having a rather large time constant.

In a receiver with a long delay in the automatic gain control loop, a fast attack time cannot be implemented. An example for such a receiver is shown in FIG. 1. The invention is not limited to the gain control circuit shown in FIG. 1. It can be applied to any gain control circuit to which the time constant for adjusting the gain is rather high.

A RF signal 2 received via an antenna 1 is provided to a RF amplifier 3. An amplified RF signal 4 is downconverted, by a oscillator 5, to an intermediate frequency range. The oscillator 5 multiplies the amplified RF signal 4 with a signal of constant frequency f0. The downconverted signal 6 is provided to an intermediate frequency filter 7, and the filtered signal 8 is amplified by an IF amplifier 9. The analogue IF signal 10 is converted, by an A/D converter 11, to a digital IF signal 12. The digital IF signal 12 serves as a starting point for further signal processing and signal decoding. Besides that, the digital signal 12 is provided to an automatic gain control unit 13, and there, the signal strength of the digital IF signal 12 is compared to a reference magnitude. The automatic gain control unit 13 generates a digital gain control signal 14 that is converted, by a D/A converter 15, into an analogue gain control signal 16. The analogue gain control signal 16 is provided to the RF amplifier 3, and the gain of said amplifier is varied in accordance with the analogue gain control signal 16.

In the AGC loop shown in FIG. 1, the RF amplifier's gain is controlled by the control signal, while the IF amplifier's output signal is used for deriving the gain control signal. Between the RF amplifier 3 and the IF amplifier 9, the group delay of the intermediate frequency filter 7 causes a time lag between the RF amplifier's output and the gain control signal. This additional delay limits the attack time of the closed-loop control circuit, and therefore, it takes a long time for the closed-loop control circuit to adjust to a different signal strength.

Many broadcast stations transmit a certain program via a set of different frequencies. On part of the receiver, the signal strengths of the broadcast signals received at different frequencies may be compared. Then, the receiver may select a reception frequency where the reception conditions are convincing. In order to monitor the broadcast signals at various alternative frequencies, the receiver has to switch from the current frequency to a possible alternative frequency, and back to the current frequency, whereby the signal reception at said current frequency must not be interrupted. Therefore, the time for switching the receiver's PLL (Phase Locked Loop) to the alternative frequency, for setting the AGC gain to the new gain value, for reading the data from the signal received at the alternative frequency, for switching back the PLL to the original frequency, and for readjusting the AGC gain to the original value is very short.

The automatic gain control circuit shown in FIG. 1 cannot be switched to a fast mode, because the AGC loop would become instable.

Figure 2:
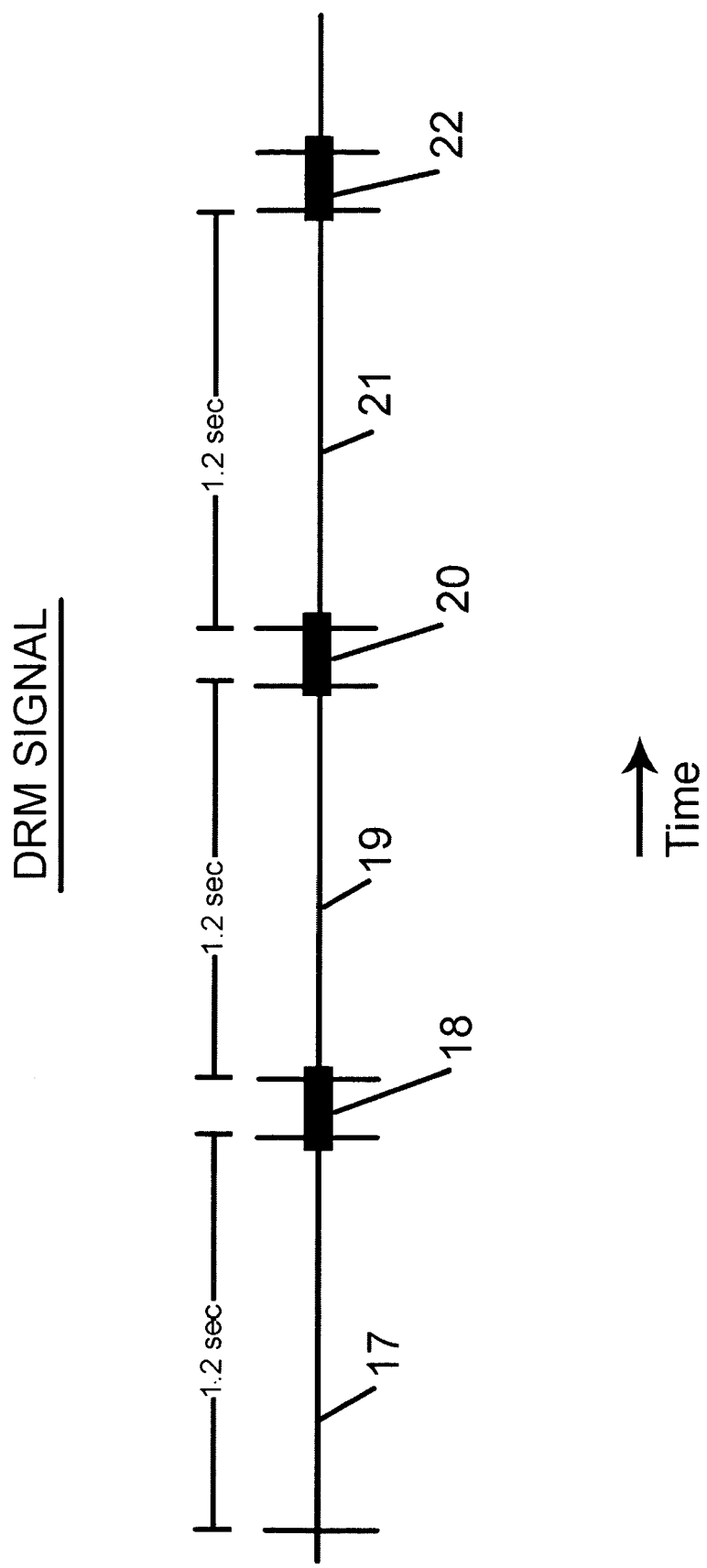
FIG. 2 is the structure of a DRM signal.

In the following discussion, it is assumed that both the broadcast signal received at the current frequency and the broadcast signals received at alternative frequencies are signals according to the DRM (Digital Radio Mondiale) standard. In FIG. 2, the structure of a DRM signal is shown as a function of time. The time intervals 17, 19, 21 have an order of magnitude of about 1.2 sec. During these time intervals, the data symbols that carry the bits and bytes of the respective radio program's data stream are transmitted. Each of the long time intervals 17, 19, 21 is followed by a short time slot 18, 20, 22, and during these short time slots of approximately 18.66 to 48 ms, static data symbols are transmitted. The reception of static data symbols during the time slots 18, 20, 22 does not cause any audible distortions for the listener.

The time slots 18, 20, 22 can therefore be used for monitoring alternative frequencies. Monitoring an alternative frequency requires the steps of changing the receiver's PLL to the alternative frequency, settling the gain of the receiver to the signal strength at said alternative frequency, evaluating the received data, and switching back to the current frequency. Because of the rather large settling time of the automatic gain control circuit, it is impossible to perform all these tasks during a single one of the time intervals 18, 20, 22.

According to the invention, the monitoring of a broadcast signal at an alternative frequency is performed as follows: during a first one of the time slots for static data symbol reception, for example during the time slot 18, the receiver's PLL is switched to the alternative frequency, and the control loop of the gain control circuit starts to adjust the gain to the signal strength of the broadcast signal received at the alternative frequency. At the end of the time interval 18, the receiver's gain has settled to the signal strength of the alternative signal. The appropriate gain value corresponding to the alternative frequency is stored. For example, the respective gain value might be stored in a register of a programmable AGC circuit. At the end of the time slot 18, the PLL is switched back from the alternative frequency to the current frequency, the gain value corresponding to the current frequency is restored, and during the following time interval 19, reception of the data stream transmitted at the current frequency is continued.

At the beginning of the time slot 20, the received frequency is again switched to the alternative frequency, and the gain value corresponding to said alternative frequency, which has been determined during the time slot 18, is written to the receiver's gain control unit. In order to make sure that an overflow of the A/D converter is avoided, the stored AGC gain should be slightly reduced before it is written to the receiver's gain control unit. While a low input range of the A/D converter can be handled by the digital signal processing, an ADC input signal that is too high leads to a saturation of the A/D converter, and it becomes impossible to check the broadcast signal at the alternative frequency. The AGC's "settling time", which might have an order of magnitude of 10 to 20 ms, is replaced by a "setting time" of less than 1 msec. At the beginning of the time slot 20, the gain value is instantaneously switched to an appropriate value, and though the AGC's time constant is rather high, decoding of the broadcast signal transmitted at the alternative frequency can start immediately.

Next, it has to be checked whether the radio program transmitted at the alternative frequency is identical to the radio program of the current frequency. For this purpose, the bit stream received during the time slot 20, after the received frequency has been set to the alternative frequency, is correlated to the bit stream corresponding to the current frequency's radio program, which is already known at the beginning of time slot 20. In case the radio programs transmitted at the current frequency and at the alternative frequency are identical, it might make sense to switch to the alternative frequency. Before doing that, it has to be checked if the signal strength at the alternative frequency is indeed higher than the signal strength at the present frequency. The signal strengths can e.g. be compared by relating the gain value of the alternative frequency to the gain value of the present frequency. In case the signal strength at said alternative frequency exceeds the signal strength at the current frequency by a predefined amount, it can be concluded that a change of the PLL's frequency would considerably improve the reception conditions. In this case, the received frequency is switched over to the alternative frequency, and the reception of the current audio program is continued at the alternative frequency.

The two tasks of correlating the bit streams transmitted at the present frequency and at the alternative frequency and of comparing the signal strengths may be performed in arbitrary order, and they might as well be performed in parallel. Both tasks are performed during the time slot 20, and at the end of time slot 20, it is clear whether frequency switching should be performed or not.

The invention might as well be used for monitoring a whole set of alternative frequencies. There do exist radio stations that broadcast their radio programs at a multitude of different frequencies. For each one of said alternative frequencies, a separate gain value might be determined and stored in a dedicated register. As soon as these gain values are available, it becomes possible to quickly switch from one frequency to another frequency without been restricted by the AGC's settling time. The signal strengths and the programs at several alternative frequencies can be monitored during the reception of the current frequency's broadcast signal. Then, the frequency channel with the best reception conditions can be selected.

The invention can also be used for checking alternative frequencies when receiving a FM broadcast signal. FM signals do not comprise a time slot structure as shown in FIG. 2. When switching the received frequency to an alternative frequency, the gain level of the automatic gain control is set to a predefined gain value that corresponds to the expected signal strength at said alternative frequency. For example, for each alternative frequency of a set of alternative frequencies, a corresponding gain value might be stored, e.g. in a table maintained in the gain control circuitry. Whenever a certain alternative frequency is monitored, the corresponding gain value is written to the automatic gain control. The time period for adjusting the receiver's gain to the alternative frequency signal is considerably reduced.

Another strategy is to use the gain value at the present frequency as a starting point, and to decrease said gain value by a predefined amount. The dynamic range of a FM receiver's input signal covers about 120 dB, and therefore, the AGC gain at the present frequency might for example be reduced by 40 dB or more (depending on the current signal strength) when switching to an alternative frequency. In case the signal strength of the FM signal at said alternative frequency is considerably higher than the signal strength at the present frequency, there is a low risk that saturation of the control circuit's A/D converter occurs, and processing of the received can start immediately. In case the FM signal received at the alternative frequency is weak, the gain level (which has been reduced by 40 dB) might be to small. This doesn't matter, though, because a FM signal with a low signal strength is not worth to be analysed anyway. Another strategy is to iteratively reduce the gain value, for example in steps of 20 or 40 dB, when checking a FM signal at an alternative frequency.

Next, the signal strength at the alternative frequency is determined. The receiver determines the signal strength of the FM signal received at the alternative frequency by combining the knowledge of the AGC gain and the measurement of the FM signal's amplitude. Then, in a second step, the receiver starts decoding the FM data. In particular, the PI (Program Information) of the radio program transmitted at the alternative frequency can be obtained by decoding the RDS (Radio Data System) signal component of the FM signal. By comparing the PI code of the alternative frequency's radio program with the PI code of the current radio program, it is possible to determine whether the programs are identical or not. In case the signal strength at the alternative frequency is considerably higher than the signal strength at the present frequency, and in case the programs are identical, it makes sense to switch to the alternative frequency and to continue receiving said radio program at the alternative frequency. The listener might not even notice that the received frequency has been changed.

LIST OF REFERENCE SYMBOLS

1 antenna
2 RF signal
3 RF amplifier
4 amplified RF signal
5 oscillator
6 downconverted signal
7 intermediate frequency filter
8 filtered signal
9 IF amplifier
10 analogue IF signal
11 A/D converter
12 digital IF signal
13 automatic gain control unit
14 digital gain control signal
15 D/A converter
16 analogue gain control signal
17, 19, 21 time intervals
18, 20, 22 time slots

The invention claimed is:

1. A method for monitoring DRM broadcast signals at alternative frequencies during reception of a DRM broadcast signal at a present frequency, said DRM broadcast signals including static data symbols during time slots and radio program data during time intervals, said time slots and said time intervals being arranged in a sequence, in which one time slot is followed by one time interval and vice versa, said method comprising: receiving radio program data at a present frequency during a first time interval with a receiver gain of a present gain value; switching to an alternative frequency during a first time slot, wherein during said first time slot said receiver's gain settles to a second gain value; switching to said present frequency during a second time interval; receiving further radio program data at said present frequency during said second time interval with a receiver gain of said present gain value; switching to said alternative frequency during a second time slot to check a broadcast signal; instantaneously switching the receiver's gain from said present gain value to said second gain value; and checking said broadcast signal at said alternative frequency during said second time slot.

2. The method according to claim 1, further comprising:
   determining whether the program transmitted via the broadcast signal at said alternative frequency is the same as the program transmitted via the broadcast signal at the present frequency.

3. The method according to claim 1, further comprising:
   comparing the signal strength of the broadcast signal received at the alternative frequency to the signal strength of the broadcast signal received at the present frequency.

4. The method according to claim 1, wherein
   when the signal strength of the broadcast signal at the alternative frequency surpasses the signal strength of the signal at the present frequency by a predefined amount, and when the programs transmitted at both frequencies are identical, the received frequency is switched from the present frequency to the alternative frequency.

5. The method according to claim 1, further comprising:
   correlating said broadcast signal received at said present frequency and said broadcast signal received at said alternative frequency.

6. The method according to claim 1, wherein
   the second gain value is set to a predefined constant.

7. The method according to claim 1, wherein
   the second gain value is determined by reducing the present gain value by a predefined constant.

8. The method according to claim 1,
   wherein the second gain value is determined by iteratively reducing the present gain value, whereby in each step, the present gain value is reduced by a predefined constant.

9. The method according to claim 1, further comprising:
   storing a corresponding gain value adapted to the signal strength of the broadcast signal at said alternative frequency for each set of alternative frequencies.

10. A program stored on a computer readable medium, for causing a computer, when said program is executed on a computer or digital signal processor, to perform the method as defined in claim 1.

11. The method according to claim 1,
    wherein the second gain value is determined by iteratively modifying a predetermined gain value.

12. A receiver for receiving DRM broadcast signals including static data symbols during time slots and radio program data during time intervals, said time slots and said time intervals being arranged in a sequence, in which one time slot is followed by one time interval and vice versa, said receiver being configured: to receive radio program data at a present frequency during a first time interval with a receiver gain of a present gain value; to switch to an alternative frequency during a first time slot, wherein during said first time slot said receiver's gain settles to a second gain value; to switch to said present frequency during a second time interval; to receive further radio program data at said present frequency during said second time interval with a receiver gain of said present gain value; to switch to said alternative frequency during a second time slot to check a broadcast signal; and said receiver comprising: a gain control unit, wherein said gain control unit comprises: gain switching means for instantaneously switching the receiver's gain from said present gain value to said second gain value when said broadcast signal at said alternative frequency is checked.

13. The receiver according to claim 12, further comprising:
    comparator means adapted for comparing the signal strength of the broadcast signal received at the alternative frequency to the signal strength of the broadcast signal received at the present frequency.

14. The receiver according to claim 12, further comprising:
    frequency switching means adapted for switching the received frequency from the present frequency to the alternative frequency when the signal strength of the broadcast signal at the alternative frequency surpasses the signal strength of the signal at the present frequency, and when the programs transmitted at both frequencies are identical.

15. The receiver according to claim 12, further comprising:
    a correlator adapted for correlating said broadcast signal received at said present frequency and said broadcast signal received at said alternative frequency.

16. The receiver according to claim 12, further comprising:
    storage means adapted for storing, for each of a set of alternative frequencies, a corresponding gain value adapted to the signal strength of the broadcast signal at said alternative frequency.

* * * * *